United States Patent
Papasouliotis et al.

(10) Patent No.: US 6,846,745 B1
(45) Date of Patent: Jan. 25, 2005

(54) HIGH-DENSITY PLASMA PROCESS FOR FILLING HIGH ASPECT RATIO STRUCTURES

(75) Inventors: George D. Papasouliotis, Cupertino, CA (US); Vishal Gauri, San Jose, CA (US); Raihan M. Tarafdar, San Jose, CA (US); Vikram Singh, Fremont, CA (US)

(73) Assignee: Novellus Systems, Inc., San Jose, CA (US)

( * ) Notice: Subject to any disclaimer, the term of this patent is extended or adjusted under 35 U.S.C. 154(b) by 133 days.

(21) Appl. No.: 10/058,897

(22) Filed: Jan. 28, 2002

Related U.S. Application Data

(63) Continuation-in-part of application No. 09/996,619, filed on Nov. 28, 2001, now Pat. No. 6,596,654.
(60) Provisional application No. 60/310,004, filed on Aug. 3, 2001.

(51) Int. Cl.[7] ............... H01L 21/322; H01L 21/302; H01L 21/31; H01L 21/26
(52) U.S. Cl. ............... 438/706; 438/475; 438/710; 438/714; 438/723; 438/782; 438/783; 438/798
(58) Field of Search .................. 438/424, 435, 438/629, 695, 759

(56) References Cited

U.S. PATENT DOCUMENTS

| | | | | |
|---|---|---|---|---|
| 5,129,958 A | * | 7/1992 | Nagashima et al. | 134/22.1 |
| 5,252,178 A | * | 10/1993 | Moslehi | 134/1.1 |
| 5,711,998 A | | 1/1998 | Shufflebotham | |
| 6,030,881 A | * | 2/2000 | Papasouliotis et al. | 438/424 |
| 6,106,678 A | * | 8/2000 | Shufflebotham et al. | 204/192.32 |
| 6,184,158 B1 | * | 2/2001 | Shufflebotham et al. | 438/788 |
| 6,200,412 B1 | | 3/2001 | Kilgore et al. | |
| 6,232,196 B1 | | 5/2001 | Raaijmakers et al. | |
| 6,395,150 B1 | | 5/2002 | Van Cleemput et al. | |
| 6,400,023 B2 | * | 6/2002 | Huang | 257/758 |
| 6,596,653 B2 | | 7/2003 | Tan et al. | |
| 6,599,829 B2 | * | 7/2003 | Smith et al. | 438/636 |
| 2001/0044203 A1 | * | 11/2001 | Huang et al. | 438/629 |
| 2002/0179570 A1 | * | 12/2002 | Mathad et al. | 216/67 |
| 2003/0207580 A1 | | 11/2003 | Li et al. | |
| 2004/0082181 A1 | | 4/2004 | Doan et al. | |

OTHER PUBLICATIONS

Papasouliotis et al., "Method of Chemical Modification of Structure Topography", Filed Dec. 3, 2001, U.S. Patent Application Ser. Number has not yet been assigned.

Papasouliotis et al., "Process for Depositing F–Doped Silica Glass in High Aspect Ratio Structures", Filed Dec. 21, 2001, U.S. Patent Application Ser. Number has not yet been assigned.

\* cited by examiner

*Primary Examiner*—Craig A. Thompson
*Assistant Examiner*—David L. Hogans
(74) *Attorney, Agent, or Firm*—Beyer Weaver & Thomas, LLP

(57) ABSTRACT

Chemical vapor deposition processes are employed to fill high aspect ratio (typically at least 3:1), narrow width (typically 1.5 microns or less and even sub 0.15 micron) gaps with significantly reduced incidence of voids or weak spots. This deposition process involves the use of both hydrogen and fluorine as process gases in the reactive mixture of a plasma-containing CVD reactor. The process gas also includes dielectric forming precursors such as silicon and oxygen-containing molecules.

28 Claims, 5 Drawing Sheets

☐ H2 treatment: >60 sec process; 1500 sccm H2; 4700 W LF power
☐ F incorporation into film is reduced by factor of 4.

HIGH-DENSITY PLASMA PROCESS FOR FILLING HIGH ASPECT RATIO STRUCTURES

CROSS-REFERENCE TO RELATED APPLICATION

This application claims priority from prior U.S. Provisional Patent Application 60/310,004, titled "GAP FILL FOR HIGH ASPECT RATIO STRUCTURES," filed Aug. 3, 2001 by Bayman et al., and a continuation-in-part from U.S. patent application Ser. No. 09/996,619, now U.S. Pat. No. 6,596,654, titled "GAP FILL FOR HIGH ASPECT RATIO STRUCTURES," filed Nov. 28, 2001 by Bayman et al. Both of these prior patent applications are incorporated herein by reference for all purposes.

BACKGROUND OF THE INVENTION

This invention relates to electronic device fabrication processes and associated apparatus. More specifically, the invention relates to chemical vapor deposition processes for forming dielectric layers in high aspect ratio, narrow width recessed features.

It is often necessary in semiconductor processing to fill high aspect ratio gaps with insulating material. This is the case for shallow trench isolation, inter-metal dielectric layers, passivation layers, etc. As device geometries shrink and thermal budgets are reduced, void-free filling of high aspect ratio gaps (e.g., AR>3.0:1) becomes increasingly difficult due to limitations of existing deposition processes.

Most deposition methods either deposit more material on the upper region than on the lower region of a side wall or form cusps at the entry of the gap. As a result the top part of a high aspect ratio structure sometimes closes prematurely leaving voids within the gap's lower portions. This problem is exacerbated in small features. Furthermore, as aspect ratios increase, the shape of the gap itself can contribute to the problem. High aspect ratio gaps often exhibit reentrant features, which make gap filling even more difficult. The most problematic reentrant feature is a narrowing in the gap entrance caused by the etched side-walls sloping inward at the top. For a given high aspect ratio feature, this increases the ratio of gap volume to gap access area seen by the precursor species during deposition. Hence voids and seams become even more likely.

Going forward, the deposition of silicon dioxide assisted by high-density plasma chemical vapor deposition (HDP CVD)—a directional (bottom-up) CVD process—is the method of choice for high aspect ratio gap-fill. The method deposits more material at the bottom of a high aspect ratio structure than on its side-walls. It accomplishes this by directing charged dielectric precursor species downward, to the bottom of the gap. Thus, HDP CVD is not an entirely diffusion-based (isotropic) process.

Nevertheless, some overhang still results at the entry region of the gap to be filled. This results from the non-directional deposition reactions of neutral species in the plasma reactor and from sputtering/redeposition processes. The directional aspect of the deposition process produces some high momentum charged species that sputter away bottom fill. The sputtered material tends to redeposit on the side-walls. Thus, the formation of overhang cannot be totally eliminated and is inherent to the physics and chemistry of the HDP CVD process. Of course, limitations due to overhang formation become ever more severe as the width of the gap to be filled decreases, the aspect ratio increases, and the features become reentrant.

Fluorine species in the plasma have been observed to improve gap fill in HDP CVD processes. This improvement may be due to side-wall passivation and/or non-directional etching by elemental fluorine. Unfortunately, when fluorine remains in the deposited dielectric film, it can degrade film properties and electrical performance in the resulting product. Specifically, fluorine can diffuse to locations where it reacts with components or otherwise degrades electrical performance. It can also outgas to cause delamination of stacks and etch silicon to cause pits and voids. If the fluorine-containing dielectric is used for shallow trench isolation, fluorine diffusion can occur during subsequent high temperature process steps such as gate oxidation and activation anneals. The diffused fluorine may cause junction leakage, threshold voltage shifts, titanium fluoride formation to produce high resistance contacts, etc.

To improve fabrication of advanced technology devices, process fabrication technology requires better dielectric deposition processes that can fill high aspect ratio features of narrow width, without leaving gaps.

SUMMARY OF THE INVENTION

This invention addresses the needs set forth above by providing an improved dielectric fill procedure involving a fluorine etch, a hydrogen passivation, and a dielectric deposition. These three operations may be performed repeatedly to completely fill gaps in a substrate surface. Preferably, some or all of these operations employ a high-density plasma. The hydrogen passivates by scavenging fluorine/fluoride species from the deposited dielectric. This process has been found to provide void free high-quality gap filling with dielectric materials. These benefits occur even in very narrow, high aspect ratio features. Typically, the process is employed to fill gaps having a width of at most about 1.5 micrometers.

One aspect of the invention provides a method of filling gaps on a semiconductor substrate. The method may be characterized by the following sequence: (a) providing a substrate in a process chamber of a chemical vapor deposition reactor; (b) depositing a dielectric layer that partially fills the gaps; (c) etching the dielectric layer with a plasma containing a fluorine-containing species; (d) after etching, passivating the dielectric layer using a high-density plasma obtained using a hydrogen-containing process gas; and (e) depositing additional dielectric on the semiconductor substrate, using a high-density plasma.

In one embodiment, (d) and (e) are performed concurrently (or at least overlap) within a single chamber. In other words, the passivation and deposition reactions are preformed together, rather than separately. In other embodiments, the second deposition (e) is performed after passivation (d) is complete or nearly complete.

For some processes, (c), (d), and (e) are each performed multiple times in sequence. Such processes require multiple depositions to completely fill the gaps. In other processes, the gaps are completely filled with dielectric after the first pass through (e).

In many embodiments, a clean process chamber is provided after deposition and prior to etching. This ensures that the amount of dielectric deposited by the process is nearly consistent from wafer to wafer. Providing a clean process chamber may involve cleaning the process chamber, or simply removing the substrate to a second process chamber, which is clean.

Examples of process gas compositions include the following: etching operation (c) provides a process gas including at least about 50 sccm of the fluorine-containing species, passivation operation (d) provides a process gas including at least about 300 sccm (more preferably 500 sccm) hydrogen; and deposition operation (e) provides a process gas containing at least about 10 sccm of a silicon-containing precursor.

The dielectric film deposited by methods of this invention is, in one example, a silicon oxide such as $SiO_2$, a silicon oxynitride, etc. Doped and undoped versions of these compounds are produced by this invention. To produce silicon-containing dielectric films, the process gas will include a silicon-bearing compound such as $SiH_4$, $Si_2H_6$, TEOS, TMCTS, OMCTS, methyl-silane, dimethyl-silane, 3MS, 4MS, TMDSO, TMDDSO, DMDMS and mixtures thereof.

To tailor the characteristics of the dielectric, various dopants or other modifiers may be provided. Examples of dopants include boron and phosphorus. The processes of this invention may provide these dopants via volatile phosphorus-containing process gases and/or volatile boron-containing process gases. The dielectric may also comprise a silicon oxynitride. Such materials may be made via processes of this invention that employ nitrogen-containing precursors (e.g., $N_2$, $N_2O$, NO, $NH_3$, $NF_3$) and/or fluorine-containing precursors.

The detailed description below will further discuss the benefits and features of this invention.

DETAILED DESCRIPTION OF THE INVENTION

Introduction

Even though the formation of overhang and side-wall growth can not be entirely eliminated in chemical vapor deposition reactions employing plasma, this invention minimizes film growth on the gap side-walls and enhances bottom-up fill. By separately employing a fluorine etch and a hydrogen gas passivation operation, dielectric deposition is greatly improved.

The present invention provides high-density plasma chemical vapor deposition processes that can fill high aspect ratio (typically at least 3:1), narrow width (typically 1.5 microns or less and even sub 0.15 micron) gaps with significantly reduced incidence of voids or weak spots. These deposition processes employs a fluorine-containing species to improve gap fill and hydrogen to scavenge away fluorine in the deposited layer. The resulting deposited material will be substantially free of fluorine. Preferably, the deposited material is a dielectric having not more than about 500 ppm fluorine, more preferably not more than about 300 ppm fluorine.

The fluorine etch improves gap-fill, by removing side-wall deposits. In a separate operation, hydrogen scavenges the fluorine from the deposited material to greatly reduce the likelihood that fluorine atoms and ions will damage the device being fabricated. Note that this invention is not limited to any particular mechanism of action in which the hydrogen and/or fluorine participate.

As indicated, this invention pertains to improved high-density plasma (HDP) chemical vapor deposition (CVD) processes. Generally, a high-density plasma is any plasma having electron density of at least about $5 \times 10^9$ electrons per cubic centimeter. Typically, though not necessarily, high-density plasma reactors operate at relatively low pressures, in the range of 100 mTorr or lower.

Process Sequences

Figure 1A:
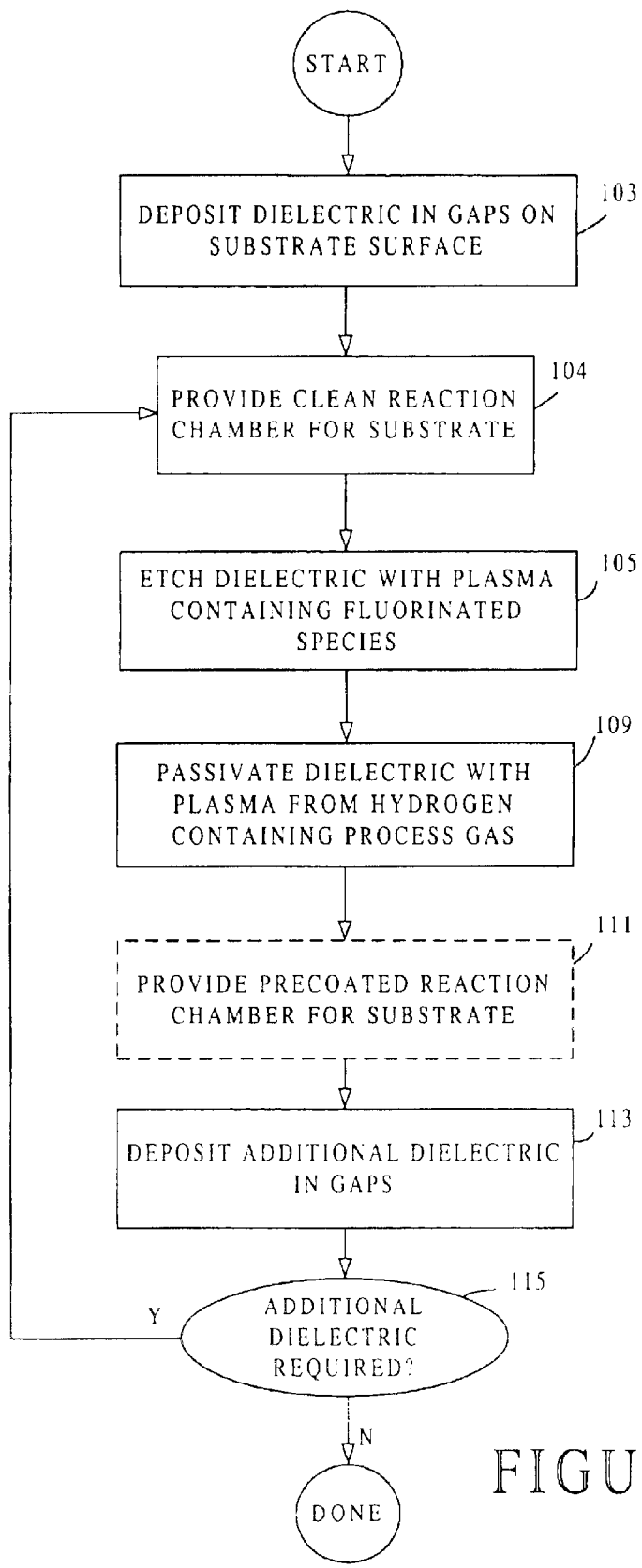
FIG. 1A is a process flow diagram depicting one process of this invention that employs separate etch, passivation, and deposition operations.
Figure 1B:
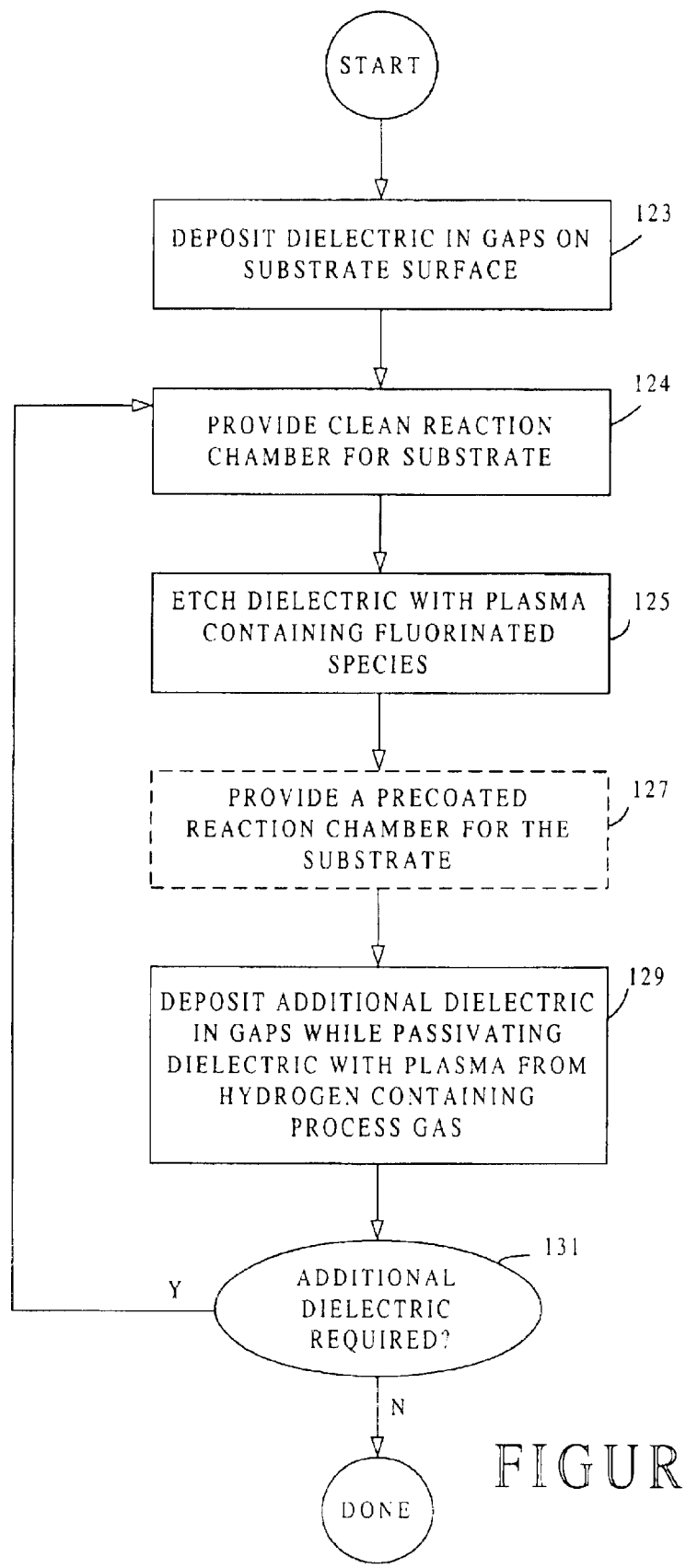
FIG. 1B is a process flow diagram depicting a second process of this invention that employs separate etch and passivation/deposition (combined) operations.

FIGS. 1A and 1B present two preferred process sequences for depositing dielectric in accordance with the present invention. In each process sequence, an initial layer of dielectric partially fills gaps on a substrate. A fluorine-containing plasma then etches this layer to remove cusps and thereby facilitate good gap filling. The detrimental effects of the fluorine are mitigated by subsequent passivation with a plasma generated from a hydrogen-containing process gas.

Turning first to FIG. 1A, a gap filling process begins at block 103 with the initial deposition of a dielectric layer in gaps of the substrate surface. As indicated, this initial layer only partially fills the gaps. So at least some additional dielectric deposition will be necessary to complete the fill.

Preferably, this initial deposition is performed via a HDP CVD process. As indicated, high-density plasma CVD provides a relatively good bottom-up fill, but it is far from perfect. Cusps almost invariably begin to form at the top of the gaps.

To remove these cusps, and otherwise promote good gap filling, the process will continue with etching of the partial layer of dielectric. But prior to that, the substrate must be provided to a clean reactor. See 104. It has been found that clean reaction chambers are sometimes necessary for process stability. That is, if the same chamber is used without cleaning between successive deposition and etch operations, the overall thickness of the deposited dielectric layer continues to increase with each successive wafer processed. Further, the uniformity of the deposited layer thickness across the wafer surface varies with each successive wafer processed. The clean chamber may be provided by various means. In one case, the wafer is simply removed from the etch chamber and placed in a different, clean chamber.

At this point, the etching takes place at 105. The etching is accomplished with a plasma-containing fluorine species. These species normally originate from a fluorine-containing process gas component such as $SiF_4$, $SiH_2F_2$, $Si_2F_6$, $C_2F_6$, $NF_3$, $CF_4$, and the like. Etching with the silicon-containing members of this set allows for a small measure of dielectric deposition during the etching, but the rate is zero or nearly zero for all practical purposes.

After etching, a clean reaction chamber may again be provided for the substrate. However, this will typically be unnecessary.

At 109, the process passivates the previously etched dielectric layer. This is accomplished by exposing the dielectric layer to a plasma generated from a hydrogen-containing process gas. As explained above, it is believed that the hydrogen scavenges much of the fluorine remaining in the dielectric after the etch operation.

When passivation has been completed, the wafer is provided to a reaction chamber. See block 111. Typically, the reaction chamber will be precoated with dielectric to condition the chamber walls. The chamber may be either a different, fresh chamber or the same chamber in which the passivation took place.

After the wafer is provided to the precoated reaction chamber, additional dielectric is deposited in the gaps of the substrate. See block 113. Typically, the process conditions employed for deposition 113 are identical or nearly identical to the process conditions employed at deposition 103. However, this need not always be the case, particularly if a variable composition within the dielectric layer is desired.

In many cases, deposition operation 113 will completely fill the gaps in the substrate surface with dielectric. But this is not always the case. Sometimes, one or more additional cycles will be required to completely fill the gaps. To this end, the process depicted in FIG. 1A includes a check 115, which determines whether additional dielectric is required to complete the process. In most situations, no actual measurement or check is performed. Rather the process is designed for a fixed number of cycles.

In this case, assuming that the gaps are not completely filled after the first cycle, the process returns to operation 104 where a clean reaction chamber is again provided for the substrate. With the wafer now in a clean chamber, the process again etches the dielectric with the fluorine-containing species at 105. Typically, though not necessarily, the etch conditions employed in this second pass through 105 are identical to the etch conditions employed in the first pass through 105.

After the second etch 105, operations 109, 111, and 113 are performed in order as described above. As with the etch, the passivation and deposition operations (109 and 113) are typically performed under the same or nearly the same conditions as employed during the first pass through this cycle. After the second pass through deposition 113, the dielectric may fill the gap completely, in which case the process is completed. However, in the event that additional deposition is necessary, the process may loop back through block 117 to a third etch-passivate-deposition cycle. Ultimately, after a certain number of cycles, the gaps will be completely filled with dielectric and the process is finished. Then after evacuating the deposition chamber and adjusting the temperature and pressure as appropriate, the substrate may be transferred for further processing.

FIG. 1B depicts a condensed version of the deposition process. Like the process of FIG. 1A, the process of FIG. 1B begins with deposition of a partial layer of dielectric (123), followed by providing a clean chamber (124), etching that dielectric layer with a fluorine species (125) and then by optionally precoating a reaction chamber for subsequent processing (127). Thereafter, however, the process deviates slightly.

Specifically, at 129, a process operation both deposits additional dielectric in the gaps and passivates the existing dielectric with plasma generated from a hydrogen-containing process gas. In essence, operations 109 and 113 from the FIG. 1A process have been combined in a single deposition/passivation operation 129. The appropriate process conditions for this combined operation will be detailed below.

As with the process depicted in FIG. 1A, the FIG. 1B process may require multiple passes through the etch and deposition/passivation operations. This possibility is illustrated with check 131, which determines whether additional dielectric must be deposited. If additional dielectric is required, the process returns to 124, where it again provides a clean reaction chamber for the substrate. After the requisite number of passes through blocks 124, 125, 127, and 129, the gaps are completely filled with void-free dielectric and the process is completed.

Figure 2A:
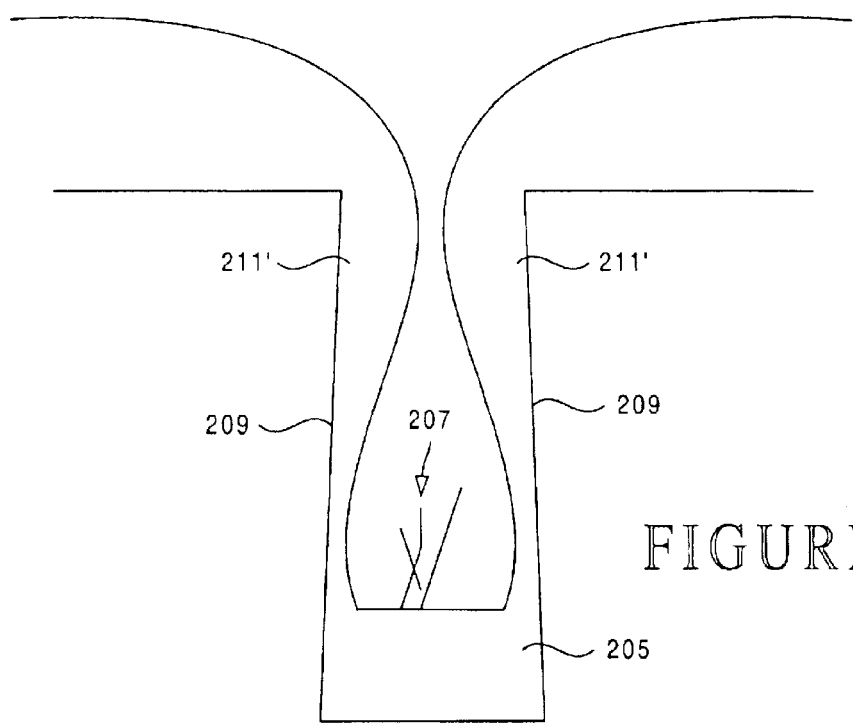
FIG. 2A is a rough schematic cross-sectional diagram of a trench or via having problematic side-wall deposition of dielectric during HDP CVD.
Figure 2B:
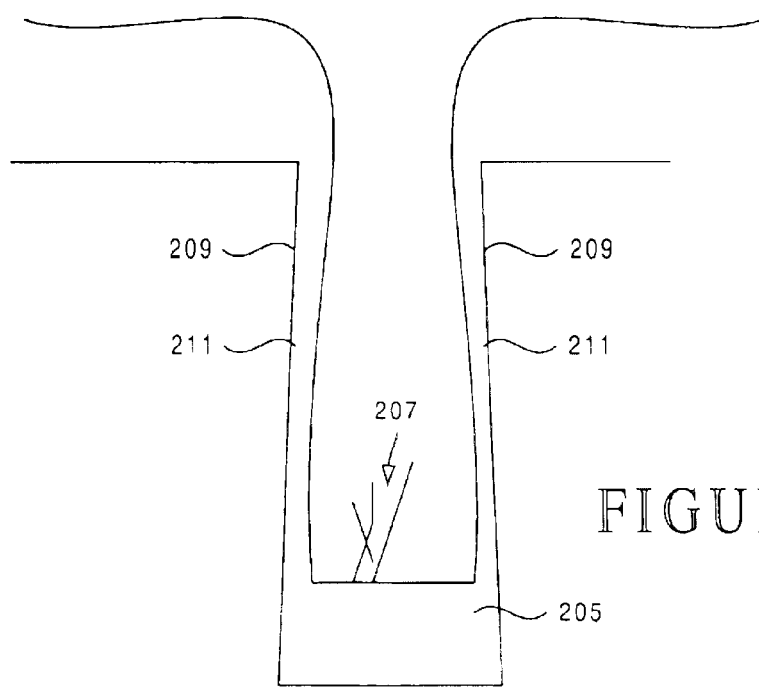
FIG. 2B is a rough schematic cross-sectional diagram of a trench or via (as in FIG. 2A) having much less side-wall deposition of dielectric because the dielectric was grown using an etch with fluorine species and a subsequent passivation with a hydrogen-containing process gas.

FIGS. 2A and 2B show in rough schematic fashion the variation in side-wall deposition that can be expected in a trench filled without separate etching via a fluorine-containing process gas component (FIG. 2A) and with etching via a fluorine-containing process gas component (FIG. 2B). In both cases, a HDP CVD process provides a bottom fill. And in both cases, dielectric material 205 from the bottom of the trench is sputtered by high momentum species from the plasma. Sputtered dielectric 207 flies out toward the side-walls 209. In the case of fluorine etch, the sputtered species are at least partially removed from the growing side-wall coverage (dielectric) 211. In the case of an etch-free process, however, side-dielectric 211' rapidly grows unhindered in a lateral direction due to unchecked redeposition of the sputtered species 207. Dielectric also deposits on the field regions.

Process Parameters

The processes depicted in FIGS. 1A and 1B include various operations, each with its own set of suitable process conditions. Many of these conditions will be apparent to those of skill in the art. To provide some guidance and illustrate preferred conditions identified to date, the following description of the etching, passivation, and deposition operations is provided.

Regarding the dielectric deposition conditions, the relevant parameters include the process gas composition, including flow rates of each component, and the physical conditions within the reactor, including substrate temperature, high frequency electrode power and low frequency electrode power.

The components of the process gas should be chosen to produce the composition of the dielectric to be deposited. In many cases, the dielectric of interest will be a silicon-containing material, such as a silicon oxide or silicon carbide, which may be doped or undoped. For such materials, the process gas will include at least, a source of silicon, a source of oxygen (if an oxide is produced), and optionally a source of dopant atoms. In certain embodiments, the deposition process gases include a noble gas such as argon, helium, and/or xenon. In other embodiments, the deposition process gases include no noble gas. As explained in the context of FIG. 1B and elaborated on below, hydrogen gas may also be provided during deposition.

As is known to those of skill in the art, many suitable precursor gases are widely available, some of which include both a source of silicon and oxygen. Examples of suitable silicon-containing precursor molecules include the following: silane ($SiH_4$), $Si_2H_6$, TEOS (tetraethyl orthosilicate), TMCTS (tetramethyl-cyclotetrasiloxane), OMCTS (octamethyl-cyclotetrasiloxane), methyl-silane, dimethyl-silane, 3MS (trimethylsilane), 4MS (tetramethylsilane), TMDSO (tetramethyl-disiloxane), TMDDSO (tetramethyl-diethoxyl-disiloxane), DMDMS (dimethyl-dimethoxyl-silane) and mixtures thereof. During deposition, the process decomposes the silicon-containing reactant to form a silicon-containing gas and plasma phase species, which can react on the surface of the substrate.

Examples of suitable oxygen-containing precursor molecules include the following: oxygen, nitric oxide (NO), and nitrous oxide ($N_2O$). If the dielectric is to contain an oxynitride (e.g., silicon oxynitride), then the process gas preferably includes a nitrogen-containing reactant such as $N_2$, $NH_3$, $NF_3$, NO, $N_2O$, and mixtures thereof.

For doped dielectrics, the process gas may include a dopant precursor such as a boron-containing gas, a phosphorus-containing gas, or a mixture thereof. Examples of suitable dopant counting precursor molecules include the following: phosphine ($PH_3$), diborane ($B_2H_6$), arsine ($AsH_3$), silicon tetrafluoride ($SiF_4$), difluorosilane ($SiH_2F_2$), and silicon hexafluoride ($SiF_6$).

Often, the process gas employed for deposition will also include a carrier gas such as helium or argon. Still other process gases such as nitrogen, ammonia, and lower hydrocarbons (such as methane, ethylene, and acetylene) may be employed depending on the composition of the dielectric to be deposited.

Generally, the silicon-containing precursor gas (e.g., silane) will be provided at a flow rate of between about 10 and 250 sccm (more preferably about 30 to 170 sccm). Depending upon the atom count in the precursor gas, the flow rate ranges may vary from the above. While there are no precise rules for modifying flow rates as a function of molecular structure, generally the flow rate of the silicon-containing precursor may be reduced by a factor corresponding to the number of silicon atoms in the molecule. So, for example, if the molecule contains two silicon atoms, one may expect to reduce the flow rate of the silicon-containing precursor by 50% to a level of between about 5 and 125 sccm.

The flow rate of oxygen-containing precursor (e.g., molecular oxygen), if required, is preferably between about 10 and 1000 sccm (more preferably about 30 to 500 sccm). Obviously, this amount can be reduced by an appropriate level when the silicon-containing precursor gas includes oxygen. In one embodiment, the inert gas flow rate is between about 0 and 1000 sccm (more preferably about 10 to 600 sccm).

The quantity of dopant-containing precursor gas, if employed in the process, varies depending upon the concentration of dopant desired in the end product. In a typical example, the flow rate of dopant-containing precursor gas is between about 0 and 250 sccm (or about 10 to 250 sccm when dopant is to be present in the deposited dielectric film).

An example of a specific process gas composition for the deposition operations follows: $SiH_4$-30 to 50 sccm; $O_2$-50 to 100 sccm; and $H_2$-800 to 1200 sccm.

In preferred embodiments of this invention, the deposition reaction takes place via high-density plasma chemical vapor deposition. An example of a suitable HDP CVD reactor will be described below. As mentioned above, a high-density plasma typically has an electron density of at least about $5\times10^9$ electrons per cubic centimeter. Process variables in HDP CVD include the pressure within the reactor, the temperature of the substrate, the frequency and power generated by a high frequency electrode and the frequency and power generated by a low frequency electrode. For deposition, the pressure within the reactor during HDP CVD is typically maintained at a level no greater than about 100 mTorr, more preferably between about 1.5 and 30 mTorr.

The temperature of the substrate within the process vessel should be maintained sufficiently high to ensure that the dielectric deposition reaction proceeds efficiently. Hence, the temperature preferably resides at values between about 200 and 1000° C. This temperature will vary depending upon the types of precursors employed in the reaction. Further, the temperature may be limited by process constraints, such as thermal budget limitations that preclude temperatures above 700–750° C. Such constraints become increasingly common with advanced technologies and corresponding smaller feature sizes. For such applications, the process temperature is preferably maintained between about 450 and 750° C. In particularly preferred embodiments, the substrate temperature is maintained between about 480 and 650° C.

To control the substrate temperature, the reactor may supply a heat transfer gas between a surface of the substrate and a surface of the substrate holder on which the substrate is supported during film deposition. The heat transfer gas may include at least one of helium and argon. The back-side helium pressure is set by the temperature requirements of the process (a typical range being between 0–15 Torr).

For some applications, it may be desirable to preheat the wafer to a pre-specified relatively low temperature and then gradually raise the temperature. This allows for isothermal operation. The goal is to start the deposition and then maintain the wafer temperature within a narrow range during the entire deposition process.

The high frequency electrode (for biasing the substrate) preferably generates a power of between about 0.2 and 10 kiloWatts during deposition, more preferably between about 0.5 and 5 kilowatts. The frequency of the high frequency electrode is typically between about 100 kHz and 27 MHz. The frequency of the low frequency electrode (upper electrode for generating plasma) is typically between about 300 kHz and 27 MHz. For many deposition reactions suitable for this invention, the power generated by the low frequency electrode is maintained between about 0.5 and 20 kilowatts, more preferably between about 2 and 10 kilowatts, and most preferably between about 3 and 5 kiloWatts. As in all plasma reactions, these power values are dependent in part on wafer size (e.g., 200 or 300 millimeter). Understand that the high frequency electrode is employed to impart momentum to charged plasma species in a direction with respect to the substrate surface (bias).

As indicated above in a discussion of FIGS. 1A and 1B, the processes of this invention typically include at least two separate deposition operations, separated by at least an etch operation. Thus, the first deposition operation only partially fills the various gaps on the substrate surface. The second and any successive deposition operations are required to complete the fill of the gaps on the substrate surface. Obviously, the thickness of the dielectric layer deposited during any of the deposition operations depends upon a variety of factors including the total number of deposition operations, as well as the depth, width, and aspect ratio of the gaps being filled. In a typical embodiment, the first deposition operation provides a dielectric layer of between about 500 and 2500 angstroms in thickness in the open areas (field regions). Each subsequent deposition operation provides a dielectric layer of thickness typically between about 500 and 6000 angstroms, again in the field regions.

Regarding the etching operations, the minimum requirement is generation of a fluorine-containing plasma under conditions sufficient to etch away cusps and/or sidewall deposits produced during the previous dielectric deposition operation(s).

Fluorine-containing plasmas are produced from fluorine-containing process gases. Examples of suitable fluorine-containing compounds for use as process gases include silicon-containing compounds such as $SiF_4$, $SiH_2F_2$, and $Si_2F_6$, fluorocarbons such as $C_2F_6$ and $CF_4$, $NF_3$, $SF_6$, and the like. When silicon-containing fluorine compounds are used, they may contribute somewhat to the deposition of dielectric during the etching. A suitable range of flow rates for the fluorine-containing process gas varies from just over 0 up to about 500 sccm, and more preferably between about 10 and 300 sccm.

Other process gases may be provided with the fluorine-containing compound(s). These include, for example, oxygen, inert carrier gases, and silicon-containing gases. In one embodiment, silane is employed at a flow rate of between about 0 and 60 sccm (more preferably between about 0 and 30), inert gas is employed at a flow rate of between about 10 and 1000 sccm (more preferably between about 100 and 1000), and oxygen is employed at a flow rate of between about 10 and 1000 sccm (more preferably between about 100 and 700).

An example of a specific process gas composition for the etching operation follows: fluorine containing compound—100 to 200 sccm; oxygen 250 to 350 sccm; and argon—50 to 100 sccm.

During etching, preferably though not necessarily, a high-density plasma is maintained. The high frequency electrode preferably operates at a power of between about 0 and 5 kilowatts, more preferably between about 0 and 2 kiloWatts, and most preferably between about 0 and 1 kilowatts, at a frequency within the range set forth above for the deposition operations. In a preferred embodiment, the etch is unbiased. The low frequency power associated with the etch is preferably between about 1 and 10 kilowatts, more preferably between about 1 and 5 kilowatts, and most preferably between about 1 and 3 kilowatts, at a frequency within the range set forth above for the deposition operations. During etching, the temperature of the substrate if preferably maintained between about 200 and 700 degrees centigrade, and more preferably between about 250 and 450 degrees centigrade. The pressure within the etching reactor is preferably maintained at a value below about 100 mTorr, more preferably between about 5 and 65 mTorr.

Regarding the passivation operation(s), sufficient hydrogen should be employed to effectively scavenge fluorine from the deposited dielectric layer(s). In addition to molecular hydrogen, the process gas may include various other components such as a carrier gas, and oxygen. The carrier gas is typically an inert gas such as helium, argon, xenon, and the like. In a preferred embodiment, molecular hydrogen is provided to the passivation reactor at a flow rate of between about 100 and 5000 sccm, more preferably between about 500 and 3000 sccm, and most preferably between about 800 and 2000 sccm. The other components of the process gas may be provided at flow rates within the following ranges for example: oxygen at between about 0 and 500 sccm and argon at between about 0 and 200 sccm.

An example of a specific process gas composition for the passivation operation follows: hydrogen—900 to 1600 sccm; oxygen—0 to 100 sccm; and argon—0 to 100 sccm.

As with the deposition and etch operations, passivation is preferably conducted with a high-density plasma in an HDP CVD reactor. The high frequency electrode preferably operates at a power of between about 0 and 5 kilowatts and more preferably between about 0 and 2 kilowatts, at a frequency within the range set forth above for the deposition operations. The low frequency power associated with the passivation is preferably between about 1 and 20 kilowatts and more preferably between about 3 and 8 kilowatts, at a frequency within the range set forth above for the deposition operations. During passivation, the temperature of the substrate if preferably maintained between about 200 and 700 degrees centigrade and more preferably between about 400 and 550 degrees centigrade. The pressure within the etching reactor is preferably maintained at a value below about 500 mTorr, more preferably between about 5 and 500 mTorr.

The duration of the etching and passivation operations varies depending upon how much etching and passivation must occur as well as the aggressiveness of the etching and passivation conditions. Note that a typical fluorine etch processes can etch at rates greater than 1 kiloangstrom/minute. In a typical process, exemplified with etch conditions as described above, the duration of any single etching operation lasts for between about 2 and 200 seconds at between about 100 and 700 angstoms/minute. And a passivation operation employed for passivation and etching conditions as described above, typically last between about 5 and 700 seconds.

As indicated in the discussion of FIG. 1B, some processes of this invention employ a passivation and deposition reaction together, as part of a single operation in a single chamber. When this is the case, the process gas must include both precursors for the dielectric deposition as well as hydrogen for the passivation. Thus, the range of components employed in such operation may be a concatenation of the process gas components listed above for deposition and passivation. Note however that the presence of hydrogen in the deposition process gas may require that the ratio of oxygen-containing precursor to silicon-containing precursor be adjusted upward (in comparison to a standard hydrogen-free process), as hydrogen reacts with and removes the oxygen from the deposition reaction.

In preferred embodiments, the flow rate of hydrogen employed in a combined deposition/passivation operation is at least about 200 sccm, and more preferably at least about 400 sccm, and most preferably at least about 500 sccm—all based on a 200 millimeter substrate. Larger substrates require higher flow rates. The flow rate for the silicon-containing precursor is preferably between about 10 and 250 sccm (more preferably about 30 to 170 sccm). As indicated above, depending upon the atom count in the precursor gas, the flow rate ranges may vary from the above.

If a dopant is required in the deposited dielectric, the flow rate of the dopant precursor is preferably between about 10 to 250 sccm, depending upon how much dopant is to be present in the deposited dielectric film.

An example of a specific process gas composition for the deposition/passivation operation follows: silane—30 to 50 sccm; oxygen—50 to 100 sccm; and hydrogen—800 to 1200 sccm.

As with the above operations, the combined deposition/passivation operation is preferably conducted under HDP CVD conditions. In this case, suitable process conditions may be as follows. The high frequency electrode preferably operates at a power of between about 0.2 and 10 kilowatts during deposition, and more preferably between about 0.5 and 5 kilowatts, at a frequency within the range set forth above for the deposition operations. The low frequency power associated with the deposition/passivation is preferably between about 0.5 and 20 kilowatts, more preferably between about 2 and 10 kilowatts, and most preferably between about 2 and 5 kilowatts, at a frequency within the range set forth above for the deposition operations. During deposition/passivation, the temperature of the substrate if preferably maintained between about 450 and 1000 degrees centigrade and more preferably between about 450 and 750 degrees centigrade. The pressure within the etching reactor is preferably maintained at a value below about 500 mTorr, more preferably no greater than about 100 mTorr, and most preferably between about 1.5 and 30 mTorr.

As indicated above, the processes of this invention may require that a wafer be provided to a clean reactor between various process operations. See for example operation 104 depicted in the process of FIG. 1A. Generally speaking, the reactor need only be as clean as is required to maintain some degree of process stability over the course of multiple wafers processed. As indicated above, it has been observed that when the deposition and etching operations are performed sequentially in the single reactor, the process stability suffers. Specifically, the total amount of dielectric deposited gradually increases with each successive wafer processed. Further, the uniformity of the thickness of the deposition layer decreases with each additional wafer processed. This instability decreases or disappears when a clean process chamber is provided between the deposition and etch operations.

A suitably clean process reactor typically will have very little dielectric species present. To clean a process chamber, one effectively reduces the level of dielectric by any of a variety of techniques. In one example, a nitrogen trifluoride/oxygen ($NF_3/O_2$) plasma etch is employed.

Another way to ensure that the process vessel is sufficiently cleaned for the particular operation at hand involves reserving certain chambers for deposition, other chambers for etching, and still other chambers for passivation (if performed separately from deposition). For each successive wafer processed, the wafer moves through the same sequence of reactors, a first one for deposition, a second one for etching, a third one for passivation, and so on.

As indicated, the purpose of passivation is to scavenge fluorine species from previously deposited dielectric. Fluorine atoms and ions are known to be highly mobile in substrate materials. Hence they may rapidly diffuse to other locations deeper within the substrate, below the dielectric layer(s). There, they may react with element and therefore reacts very rapidly.

Because of these issues, it is important to rapidly remove fluorine from the deposited dielectric before it can diffuse and react. Hence, the passivation operation should take place promptly after the etch operation is completed. To this end, passivation and etching are preferably conducted within the same chamber, in situ. In a preferred embodiment, the wafer etched in a chamber is rapidly removed from that chamber by a wafer-handling robot and moved into a separate reactor responsible for passivation. The passivation reactor should be rapidly charged with hydrogen-containing process gas, which is converted to a plasma for passivation.

HDP-CVD Reactors

Various plasma reactor designs are suitable for use with this invention. The particular designs are not critical to this invention. Different reactor designs may be employed for different operations within the overall process. For example, one reactor design may be employed for the fluorine etch and a different reactor design employed for the dielectric deposition and passivation operations. Three different designs may be employed, one for each of the operations. Or a single design may be employed for all three operations.

The reactor employed for dielectric deposition need only support HDP CVD dielectric layer formation on appropriate substrates. Examples of suitable reactors include the Novellus SPEED reactor, available from Novellus Systems, Inc. of San Jose, Calif., and the Ultima reactor, available from Applied Materials, Inc. of Santa Clara, Calif.

The principal components of most suitable reactors include a reaction chamber, a process gas delivery system, a support for the substrate, one or more electrodes to generate a plasma and a bias source for the substrate. A temperature control system is typically used to heat the substrate.

Figure 3:
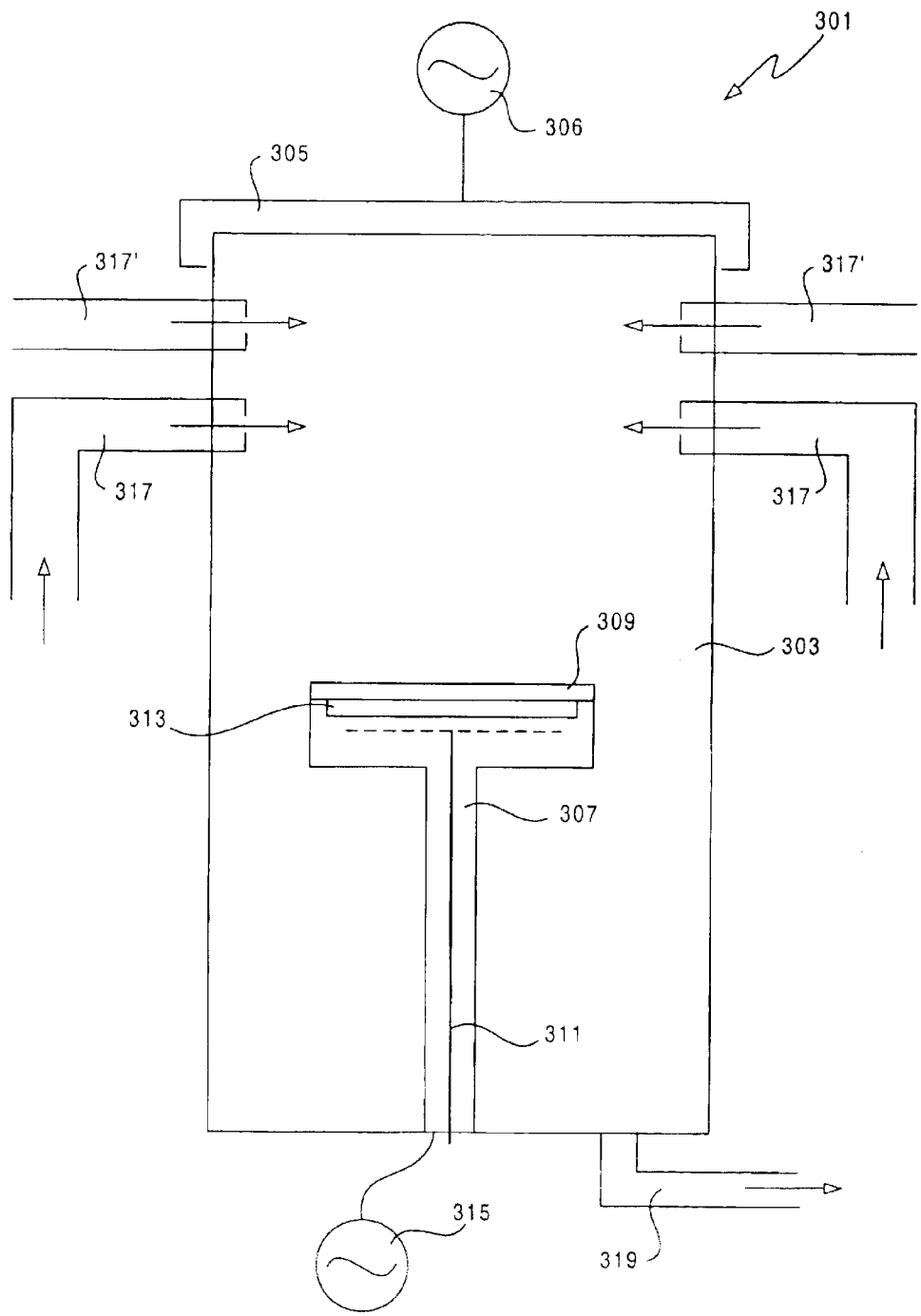
FIG. 3 is a block diagram depicting some components of a suitable CVD reactor for performing HDP CVD in accordance with this invention.

FIG. 3 provides a simple block diagram depicting various reactor components arranged as in a conventional reactor. As shown, a reactor 301 includes a process chamber 303 which encloses other components of the reactor and serves to contain the plasma generated by an electrode 305. In one example, the process chamber walls are made from aluminum, aluminum oxide, and/or other suitable material. Electrode 305 is powered by a "low frequency" rf source 306. The power and frequency supplied by source 306 is sufficient to generate high-density plasma from the process gas.

Within the reactor, a wafer pedestal 307 supports a substrate 309. The pedestal typically includes a chuck to hold the substrate in place during the processing (etching or deposition or/and passivation). The chuck may be an electrostatic chuck, a mechanical chuck or various other types of chuck as are available for use in the industry and/or research.

A heat transfer subsystem including a line 311 for supplying a heat transfer fluid controls the temperature of substrate 309. In some embodiments, the heat transfer fluid comprises at least one of helium and argon gas. The heat transfer fluid is supplied to a space 313 between the surface of the substrate and a surface of the chuck. The chuck itself may be cooled separately by water or other cooling fluid. Such fluid is provided to coils within the chuck or a jacket around the chuck.

A "high frequency" rf source 315 serves to electrically bias substrate 309 and draw charged precursor species onto the substrate for the deposition reaction. Electrical energy from source 315 is coupled to substrate 309 via an electrode or capacitive coupling, for example. Note that the bias applied to the substrate need not be an rf bias. Other frequencies and DC bias may be used as well. In a specific embodiment, source 315 supplies a radio frequency bias to the substrate, and the radio frequency bias is generated by supplying the electrode with power at least about 0.1 $W/cm^2$ of electrode surface area for deposition. Other values may be appropriate for etch and passivation. Note that in some embodiments, no rf bias is employed for etching.

The process gases are introduced via one or more inlets 317 and 317'. The gases may be premixed or not. For the passivation operation, a source of elemental hydrogen gas will be necessary. And for the etching operation, a source of fluorine-containing process gas will be necessary to provide the fluorine species needed for enhanced etching. During deposition, a source of at least the silicon-containing precursor will be necessary. Other sources of precursor gases and carrier gases may also be provided. Preferably, the process gas is introduced through a gas supply inlet mechanism including orifices. In some embodiments, at least some of the orifices orient the process gas along an axis of injection intersecting an exposed surface of the substrate at an acute angle. Further, the gas or gas mixture may be introduced from a primary gas ring, which may or may not direct the gas toward the substrate surface. Injectors may be connected to the primary gas ring to direct at least some of the gas or gas mixture into the chamber and toward substrate. Note that injectors, gas rings or other mechanisms for directing process gas toward the wafer are not critical to this invention. The sonic front caused by the gas entering the chamber will itself cause the gas to rapidly disperse in all directions—including toward the substrate. Note also that the flow rate may vary somewhat when special injector configurations are employed.

The process gas exits chamber 303 via an outlet 319. A vacuum pump (e.g., a turbomolecular pump) typically draws the gas out and maintains a suitably low pressure within the reactor.

Substrates and Dielectric Materials

The above-described processes and apparatuses may deposit dielectric on any type of substrate that requires thin dielectric layers. Often, the substrate will be a semiconductor wafer having gaps in need of dielectric filling. The invention is not, however, limited to such applications. It may be employed in a myriad of other fabrication processes such as processes for fabricating flat panel displays.

As indicated above, this invention finds particular value in integrated circuit fabrication. The gap filling processes are performed on partially fabricated integrated circuits employing semiconductor substrates. In specific examples, the gap filling processes of this invention are employed to form shallow trench isolation, pre-metal dielectric, inter-metal dielectric layers, passivation layers, etc.

As indicated, the invention can effectively fill gaps having widths of 1.5 micrometers or less and aspect ratios of 3:1 or greater. More aggressive structures having, e.g., greater aspect ratios and smaller widths may also be used. In one example the gap width is 0.15 micrometers or less.

The dielectrics employed to fill those gaps will often be a silicon oxide such as silicon dioxide, silicon oxynitride, silicon-oxycarbide, and doped variants of each of these. Therefore, the scope of the invention includes at least phosphorus-doped, boron-doped, germanium-doped, and boron/phosphorus-doped oxides. Further, the dielectric may be a phosphorus- and boron-doped silicon oxide glass (BPSG). In some cases, non-oxide dielectrics such as silicon carbide and silicon nitride may be prepared in accordance with this invention.

EXAMPLE

Figure 4:
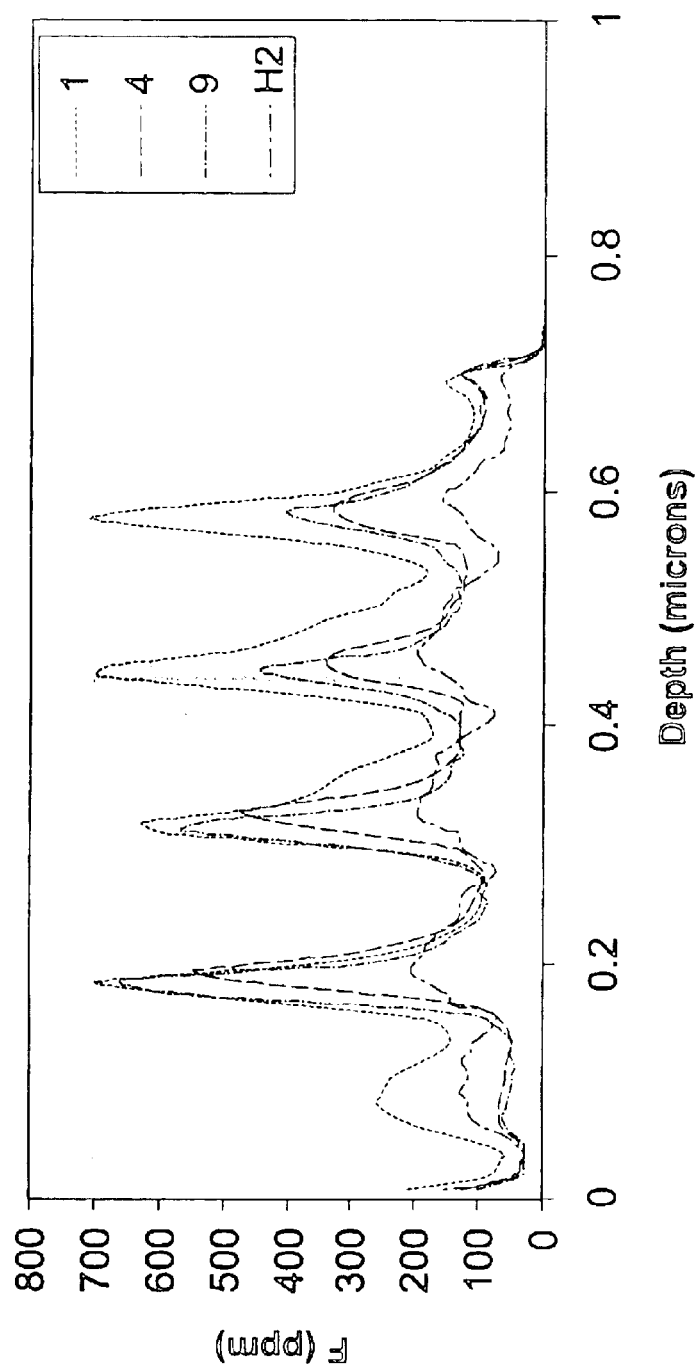
FIG. 4 is graph of fluorine concentration versus dielectric depth showing that fluorine incorporation was reduced by a factor of four when hydrogen passivation was employed.

FIG. 4 shows fluorine concentration profiles versus dielectric depth for dielectrics deposited by four processes. Importantly, in the one process employing a post-etch hydrogen passivation operation, the maximum concentration of fluorine is reduced by a factor of 3 to 4, from 500–700 ppm to under 200 ppm.

All processes were conducted in a Novellus HDP SPEED reactor. The substrate was flat with unvarying topology.

In the processes identified as 1, 4, and 9, the process conditions were as follows.

| Deposition | |
|---|---|
| SiH4 | 35 sccm |
| O2 | 65 sccm |
| H2 | 1000 sccm |
| LF | 2500 Watts |
| HF | 2500 Watts |
| Etch | |
| NF3 | 150 sccm |
| O2 | 300 sccm |
| Ar | 90 sccm |
| LF | 1600 Watts |
| HF | No bias |

In the process identified by the curve labeled H2, the process conditions were as follows:

Deposition and Etch—Same as processes 1, 4, and 9.

| Passivation | |
|---|---|
| H2 | 1500 sccm |
| LF | 4700 Watts |
| HF | No bias |

The concentration profiles shown in FIG. 4 were obtained by SIMS analysis of deposited dielectric. Interestingly, there are four separate fluorine peaks shown in the profiles. These were caused by four separate etch and deposition cycles employed to during the process. Very importantly, the graphs show that the one process example employing hydrogen passivation reduces the peak fluorine concentration by a factor of 3 to 4.

While this invention has been described in terms of a few preferred embodiments, it should not be limited to the specifics presented above. Many variations on the above-described preferred embodiments, may be employed. Therefore, the invention should be broadly interpreted with reference to the following claims.

What is claimed is:

1. A method of filling gaps on a semiconductor substrate, the method comprising
   (a) providing a substrate in a process chamber of a chemical vapor deposition reactor;
   (b) depositing a dielectric layer that partially fills the gaps;
   (c) etching the dielectric layer with a plasma containing a fluorine-containing species;
   (d) after etching, passivating the dielectric layer by scavenging fluorine-containing species from the dielectric layer using a high-density plasma obtained using a molecular hydrogen containing process gas, wherein at least some of the passivating occurs without depositing dielectric and wherein the scavenged species were introduced by the etching in (c); and
   (e) depositing additional dielectric on the semiconductor substrate, using a high-density plasma.

2. The method of claim 1, wherein (d) and (e) are performed concurrently within a single chamber.

3. The method of claim 1, wherein (e) is performed after (d) is complete.

4. The method of claim 1, further comprising providing a clean process chamber after deposition and prior to etching.

5. The method of claim 4, wherein providing a clean process chamber comprises cleaning the process chamber.

6. The method of claim 4, wherein providing a clean process chamber comprises removing the substrate to a second process chamber, which is clean.

7. The method of claim 1, further comprising repeating (c), (d), and (e) one or more times.

8. The method of claim 1, wherein (e) completely fills the gaps with dielectric.

9. The method of claim 1, wherein the dielectric fills gaps having a width of at most about 1.5 micrometer.

10. The method of claim 1, wherein (d) comprises introducing a process gas containing at least about 300 sccm hydrogen.

11. The method of claim 1, wherein (c) comprises introducing a process gas comprising at least about 50 sccm of the fluorine-containing species.

12. The method of claim 1, wherein (e) comprises applying a bias to the substrate, to thereby deposit the additional dielectric via high-density plasma chemical vapor deposition on the semiconductor subs.

13. The method of claim 1, wherein the fluorine-containing species is selected from the group consisting of $SiF_4$, $Si_2F_6$, $NF_3$, $C_2F_6$, $S_2F_6$, and mixtures thereof.

14. The method of claim 1, wherein (c) comprises maintaining the semiconductor substrate at a temperature of between about 250 and 1000° C. during etching.

15. The method of claim 1, wherein (d) comprises maintaining the semiconductor substrate at a temperature of between about 350 and 1000° C. during passivation.

16. The method of claim 1, wherein the dielectric film comprises a silicon oxide.

17. The method of claim 1, wherein the dielectric film comprises $SiO_2$.

18. The method of claim 2, wherein (d) and (e) together comprise introducing a deposition process gas comprising nitrogen and hydrogen.

19. The method of claim 1, wherein (e) comprises introducing a deposition process gas comprising a component selected from the group consisting of boron-containing gas, phosphorus-containing gas, a fluorine-containing gas, and mixtures thereof.

20. The method of claim 1, wherein (e) comprises introducing a deposition process gas comprising a silicon-bearing compound selected from the group of $SiH_4$, $Si_2H_6$, TEOS, TMCTS, OMCTS, methyl-silane, dimethyl-silane, 3MS, 4MS, TMDSO, TMDDSO, DMDMS and mixtures thereof.

21. The method of claim 1, wherein (e) comprises introducing a deposition process gas comprising a reactant selected from the group consisting of $N_2$, $N_2O$, NO, $NH_3$, $NF_3$, $O_2$, and mixtures thereof.

22. The method of claim 1, wherein at least one of (b), (c), (d), and (e) comprises supplying a heat transfer gas between a surface of the substrate and a surface of the substrate holder on which the substrate, is supported during the film growing.

23. The method of claim 22, wherein the heat transfer gas comprises at least one of helium and argon and is supplied to a space between the surface of the and a surface of the chuck.

24. The method of claim 1, wherein at least one of (b), (c), (d), and (e) comprises introducing process gas through a gas supply including orifices, at least some of the orifices orienting the process gas along an axis of injection intersecting an exposed surfaced of the substrate at an acute angle.

25. The method of claim 24, wherein introducing the process gas comprises supplying a gas or gas mixture from a primary gas ring, wherein at least some of said gas or gas mixture is directed toward said substrate.

26. The method of claim 25, wherein injectors are connected to said primary gas ring, the injectors injecting at least some of said gas or gas mixture into said chamber and directed toward substrate.

27. A method of filling gaps on a semiconductor substrate, the method comprising
(a) providing a substrate in a process chamber of a chemical vapor deposition reactor;
(b) depositing a dielectric layer that partially fills the gaps;
(c) etching the dielectric layer with a plasma containing a fluorine-containing species;
(d) after etching scavenging fluorine containing species from the dielectric layer using a high-density plasma obtained from a molecular hydrogen containing process gas, wherein at least some of the passivating occurs without depositing dielectric and wherein the scavenged species were introduced by the etching (c); and
(e) depositing additional dielectric on the semiconductor substrate, using a high-density plasma.

28. The method of claim 27, wherein at least some of the passivating of (d) occurs at simultaneously with at least some of the deposition of (e).

* * * * *